Figure 1:
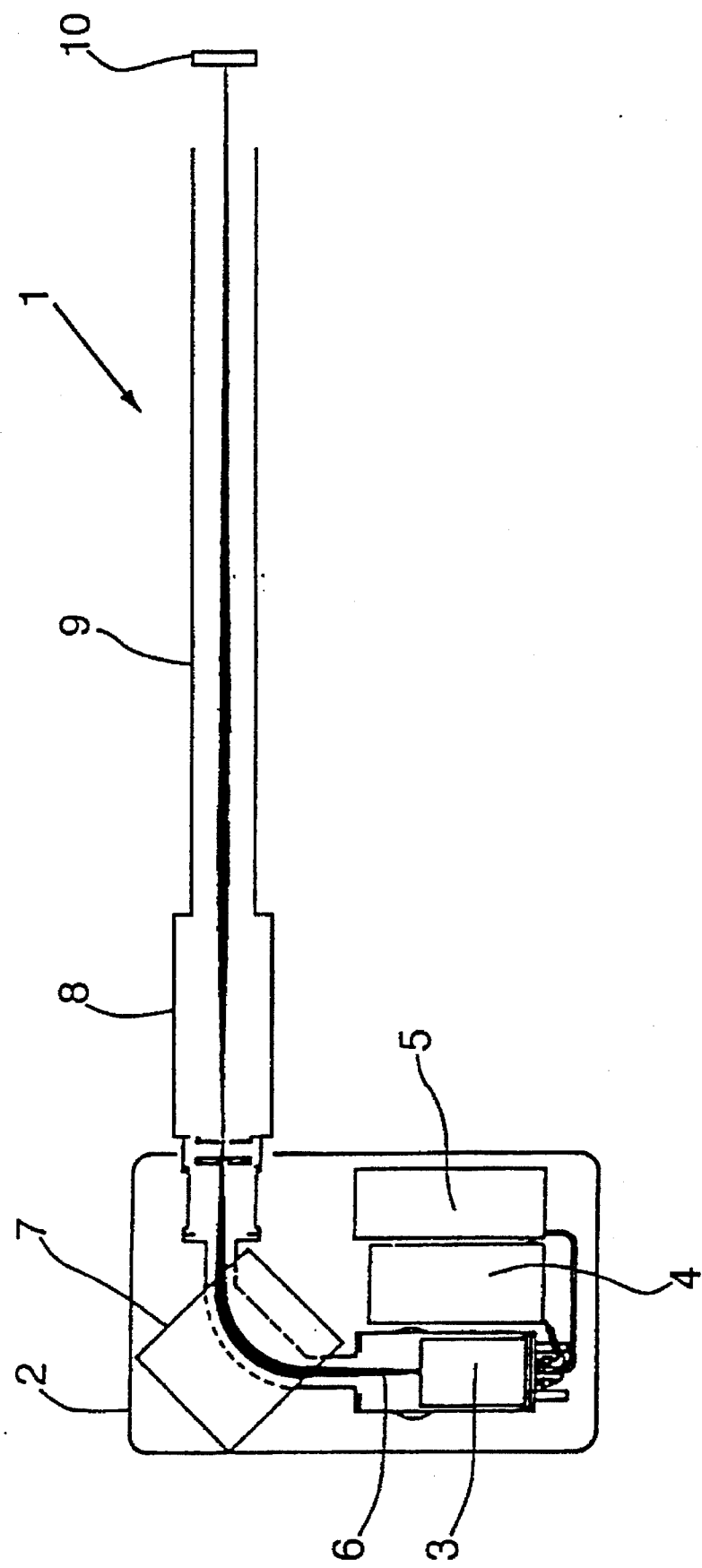

United States Patent [19]

Grouillet

[11] Patent Number: 5,625,195
[45] Date of Patent: Apr. 29, 1997

[54] HIGH-ENERGY IMPLANTATION PROCESS USING AN ION IMPLANTER OF THE LOW- OR MEDIUM-CURRENT TYPE AND CORRESPONDING DEVICES

[75] Inventor: Andre Grouillet, Grenoble, France

[73] Assignee: France Telecom, Paris, France

[21] Appl. No.: 564,121

[22] PCT Filed: Apr. 5, 1995

[86] PCT No.: PCT/FR95/00433

§ 371 Date: Nov. 27, 1995

§ 102(e) Date: Nov. 27, 1995

[87] PCT Pub. No.: WO95/27996

PCT Pub. Date: Oct. 19, 1995

[30] Foreign Application Priority Data

Apr. 6, 1994 [FR] France ................................. 94 04027

[51] Int. Cl.$^6$ .................................................. H01J 37/317
[52] U.S. Cl. ................ 250/492.21; 250/423 R; 315/111.81
[58] Field of Search .................. 250/492.2, 492.21, 250/423 R; 315/111.81; 378/34

[56] References Cited

U.S. PATENT DOCUMENTS

| | | | |
|---|---|---|---|
| 5,327,475 | 7/1994 | Golovanivsky et al. | 378/34 |
| 5,355,399 | 10/1994 | Golovanivsky et al. | 378/119 |
| 5,449,920 | 9/1995 | Chan | 250/492.21 |
| 5,483,077 | 1/1996 | Glavish | 250/492.21 |

FOREIGN PATENT DOCUMENTS

0527082A1  2/1993  European Pat. Off. .

OTHER PUBLICATIONS

Production of Milliampere Class Mass-Separate Multiply Charged Ion Beam J. Vac. Sci. Tech. vol. 9, No. 2 published Apr. 1991, pp. 307–311.
Patent Abstract of Japan, vol. 18, Number 252 JP, A, 06 036 235, Mar. 1994.

*Primary Examiner*—Bruce C. Anderson
*Attorney, Agent, or Firm*—Robbins, Berliner & Carson, LLP

[57] ABSTRACT

In order to increase the implantation energy of an ion implanter of the medium-current type, a microwave generator, having a traveling-wave tube generating an electromagnetic field with a frequency greater than or equal to 6 GHz, is arranged in the implanter; the initial ion source of the implanter is replaced by an electron cyclotron resonance multiply-charged ion source (3) including a waveguide-forming plasma cavity (21) whose characteristic dimension (D), in the transverse plane of the cavity, is of the same order of magnitude as the wavelength of the electromagnetic field; the microwave generator (60) and the plasma cavity (21) of the multiply-charged ion source are electromagnetically coupled; a complex gaseous medium, compatible with the beam of ions desired, is admitted into the plasma cavity and the inlet flow rate of the gaseous medium is adjusted so as to maintain a residual vacuum in the plasma cavity which is less than a pressure threshold compatible with the production of multiply-charged ions; and the focusing of the ion beam extracted from the plasma cavity is adjusted onto the focal point of the scanning magnet (7) of the implanter.

15 Claims, 3 Drawing Sheets

HIGH-ENERGY IMPLANTATION PROCESS USING AN ION IMPLANTER OF THE LOW- OR MEDIUM-CURRENT TYPE AND CORRESPONDING DEVICES

The invention relates to low- or medium-current ion implantation, especially in microelectronics.

The first uses of high-energy ion implantation in microelectronics concerned the fabrication of CCD (Charge Coupled Device) sensors and the programming of read-only memories, for example for electronic games.

High-energy ion implantation (of the order of 600 to 700 keV of phosphorus ions into silicon) has since found other applications, for example for improving lateral isolation in CMOS circuits having a high density of integration.

High-energy ion implantation also has many advantages in the fabrication of semiconductor components. It thus makes it possible to effect a field isolation ("channel stopper") which, in addition to better lateral isolation, offers a reduction in the $n^+/p^+$ distance between NMOS and PMOS transistors and in the diffusion of the dopants into the active zones of the semiconductor component during oxidation.

Another advantage resides in the production of thin and localized buried collectors in bipolar technologies. Such an ion implantation requires doses of a few $10^{14}$ ions of phosphorus per $cm^2$ with an energy of 1.5 MeV or else of boron at 800 keV.

Mention may be also made of the production of buried layers in order to decrease leakage currents via the substrate. Currently, such production is generally carried out by epitaxy, which is a delicate and expensive technique in an industrial environment. It is therefore preferable to carry out the ion implantations at doses [lacuna] $10^{15}$ ions per $cm^2$ of phosphorus at 1.5 MeV or else of boron at 800 keV.

However, energies of the order of 1 MeV (mega-electron-volt) currently require recourse to the costly solution of conventional linear-type accelerators. Such machines exist but they are very costly and remain laboratory machines since industrialists reproach them for their lack of reliability and of flexibility and, above all, hesitate to invest in a machine meeting the requirements of only a small number (one, or perhaps two) technological steps.

In order for high-energy implantation to become a relatively approachable technique for industrialists, one solution consists in using multiply-charged ions. However, the ion sources used are generally hot-filament sources which have an operating lifetime of about twenty hours or so and furthermore only allow low available currents to be obtained, resulting in the production of multiply-charged ion doses which barely exceed $10^{13}/cm^2$ (see in particular the article by A. GROUILLET et al., "Device performances and parametric studies of high energy implantations with multiple charged ion beams" ION IMPLANTATION TECHNOLOGY—92, p. 417–420).

Moreover, another type of multiply-charged ion source exists which combines, at the same time, two high magnetic fields (one axial and the other radial) as well as injection of a microwave electromagnetic field into an ionization chamber, the dimensions of which are calculated so that the source works in the electron cyclotron resonance condition, making it possible to produce, from a gas admitted into the ionization chamber, an ionized gaseous plasma containing highly charged ions.

This type of ion source was initially developed in order to be applied to nuclear fusion. Thus it has been possible to obtain multiply-charged ions such as $Ar^{13+}$, $Kr^{20+}$ or $Xe^{20+}$. However, such sources are extremely heavy and bulky, without counting the volume of the power-supply unit which they require, and these constraints mean that adapting them to conventional industrial implanters is totally out of the question.

It is true that a small-sized electron cyclotron resonance (ECR) source is known from European Patent Application No. 0.527.082. Nevertheless, the source described in this prior document, associated with a microwave supply producing the microwave energy necessary to generate the ionized plasma, cannot be arranged in a conventional implanter especially because of the dimensional constraints of the source/microwave supply assembly. Furthermore, the ionized output beam of the source described in this prior document has geometrical characteristics incompatible with most standard industrial implanters. Moreover, the usual diameter of the output beam of such an ECR source, typically a few millimeters, as well as the use of simple gases such as hydrogen, neon, xenon, argon, oxygen, tungsten or titanium, easily allow the use of such a source in applications of isotropic [sic] separation but render this source, as it is, unsuitable for applications of multiply-charged ion implantation in the microelectronics field and also unable to be used, as it is, in standard industrial implanters.

The object of the invention is to increase the implantation energy of a conventional industrial implanter of the low- or medium-current type, the maximum implantation energy of which does not exceed a few hundreds of keV, typically 200 to 250 keV, in order to obtain, simply and at an industrially acceptable cost, energies of the order of 1 MeV, while at the same time making it possible to achieve ion doses which may reach as high as $10^{14}/cm^2$ or even higher.

From the standpoint of the present invention, an implanter of the low- or medium-current type is an implanter whose total beam current intensity measured downstream of the accelerator is less than approximately 5 mA.

The object of the invention is also to make such a conventional ion implanter work with an electron cyclotron resonance ion source, although none such implanters is initially equipped with such a type of source. The reason for this is that the ion sources conventionally used in this type of implanter are generally hot-filament sources or cold-cathode sources.

The object of the invention is also to allow replacement of the conventional sources, for example hot-filament sources, existing in such implanters with an electron cyclotron resonance ion source equipped with its microwave supply, while at the same time meeting the size constraints of these existing implanters.

Another object of the invention consists in allowing adaptation of such an electron cyclotron resonance source to most industrial implanters of the low- or medium-current type.

The object of the invention is also to obtain particularly stable multiply-charged ion beams with scanning currents of a few tens of microamps, especially with $p^{4+}$, $p^{5+}$ and $p^{6+}$ phosphorus ions.

The invention therefore provides a high-energy implantation process using an ion implanter of the low- or medium-current type, in which:

- a microwave generator, having a traveling-wave tube generating an electromagnetic field with a frequency greater than or equal to 6 GHz, is arranged in the implanter;
- an electron cyclotron resonance multiply-charged ion source is arranged in the implanter, this source including a waveguide-forming plasma cavity whose characteristic dimension, in the transverse plane of the cavity, is of the same order of magnitude as the wavelength of the electromagnetic field;

the microwave generator and the plasma cavity of the mutiply-charged ion source are electromagnetically coupled;

a complex gaseous medium, compatible with the beam of ions desired, is admitted into the plasma cavity and the inlet flow rate of the gaseous medium is adjusted so as to maintain a residual vacuum in the plasma cavity which is less than a pressure threshold compatible with the production of multiply-charged ions; and the focusing of the ion beam extracted from the plasma cavity is adjusted onto the focal point of the scanning magnet of the implanter.

In general, the microwave generator is chosen so as to have a small size, typically less than 50 dm$^3$, in order to be able to be housed inside the implanter and advantageously inside the casing of the power-supply unit for the initial ion source of the implanter. The function of the traveling-wave tube microwave generator used here is therefore twofold. The reason for this is that this type of generator, known for its applications in the radar field, allows, on the one hand, generation of the electromagnetic field with the desired frequency and, on the other hand, easy insertion into the implanter, and especially into the casing of the power-supply unit for the initial source, because of its small size.

According to one way of implementing the process, the complex gaseous medium is advantageously chosen from the group formed by the gases of chemical formulation $PH_3$, $B_2H_6$, $A_sH_3$ [sic], $PF_5$, $A_sF_5$ [sic], $BF_3$, $PCl_5$, $A_sCl_3$ [sic], $BCl_3$ and more generally the hydrides, fluorides and chlorides of the dopants compatible with the nature of a semiconductor material to be implanted.

Advantageously, the inlet flow rate of the complex gaseous medium into the plasma cavity is adjusted so as to maintain a pressure of less than $10^{-6}$ torr and preferably of a few $10^{-7}$ torr in said cavity, which makes it possible to produce a stable beam of highly charged ions, especially $p^{4+}$, $p^{5+}$, $p^{6+}$ phosphorus ions.

The subject of the invention is also a device for generating an ionized gas beam for an ion implanter of the medium-current type. According to a general characteristic of the invention, this device comprises an electron cyclotron resonance multiply-charged ion source including a waveguide-forming plasma cavity which is capable of receiving a complex gaseous medium compatible with the ion beam generated and is coupled to a microwave generator having a traveling-wave tube generating an electromagnetic field with a frequency greater than or equal to 6 GHz, for example 10 GHz; the plasma cavity has a characteristic dimension, in the transverse plane of the cavity, of the same order of magnitude as the wavelength of the electromagnetic field; moreover, the source is provided at its output end with an ion optics system for adjusting the geometrical characteristics of the beam extracted from the cavity, said ion optics system being controllable and interacting with the beam extraction electrode of the ion source; furthermore, the source is provided at its input end with means for admitting the gaseous medium, for example an inlet valve of the ultra-vacuum type, which are compatible with maintaining a residual vacuum pressure of less than $10^{-6}$ torr in operation.

According to one embodiment of the invention, the beam extraction electrode of the source includes an extraction cone flaring out toward the output of the source, while the ion adjustment optics system includes a first drilled plane electrode blocking off the flared face of the extraction cone, a second drilled plane electrode, spaced away from the first one and at the same potential, typically at ground potential, as that of the extraction cone and of the first electrode, and a plane and drilled central electrode which is arranged between the first and second electrodes and biased with respect to these two electrodes by an adjustable bias voltage.

According to one embodiment of the device according to the invention, the ion optics system is fastened to the source by a first electrical isolator while the source is secured to a fastening flange equipped with a second electrical isolator, the fastening flange being intended to be fastened via this second electrical isolator to the ion implanter.

The microwave generator advantageously forms a microwave supply module separated from the source equipped with its fastening flange and with its ion adjustment optics system; this microwave supply module has a working volume of less than 50 dm$^3$ and includes the traveling-wave tube connected to an oscillator via a variable attenuator, as well as the power-supply units for these elements. The microwave supply module is then coupled to the plasma cavity of the source via a waveguide.

The subject of the invention is also a multiply-charged ion source for an ion implanter of the medium-current type. This source includes a waveguide-forming plasma cavity whose characteristic dimension, in its transverse plane, is of the same order of magnitude as the wavelength of the electromagnetic field to which it is intended to be coupled, an ion output optics system for adjusting the ion beam extracted from the cavity, said optics system being controllable and interacting with a beam extraction cone of the source, and a valve, of the ultravacuum type, for admitting a complex gaseous medium into the cavity.

Figure 2:
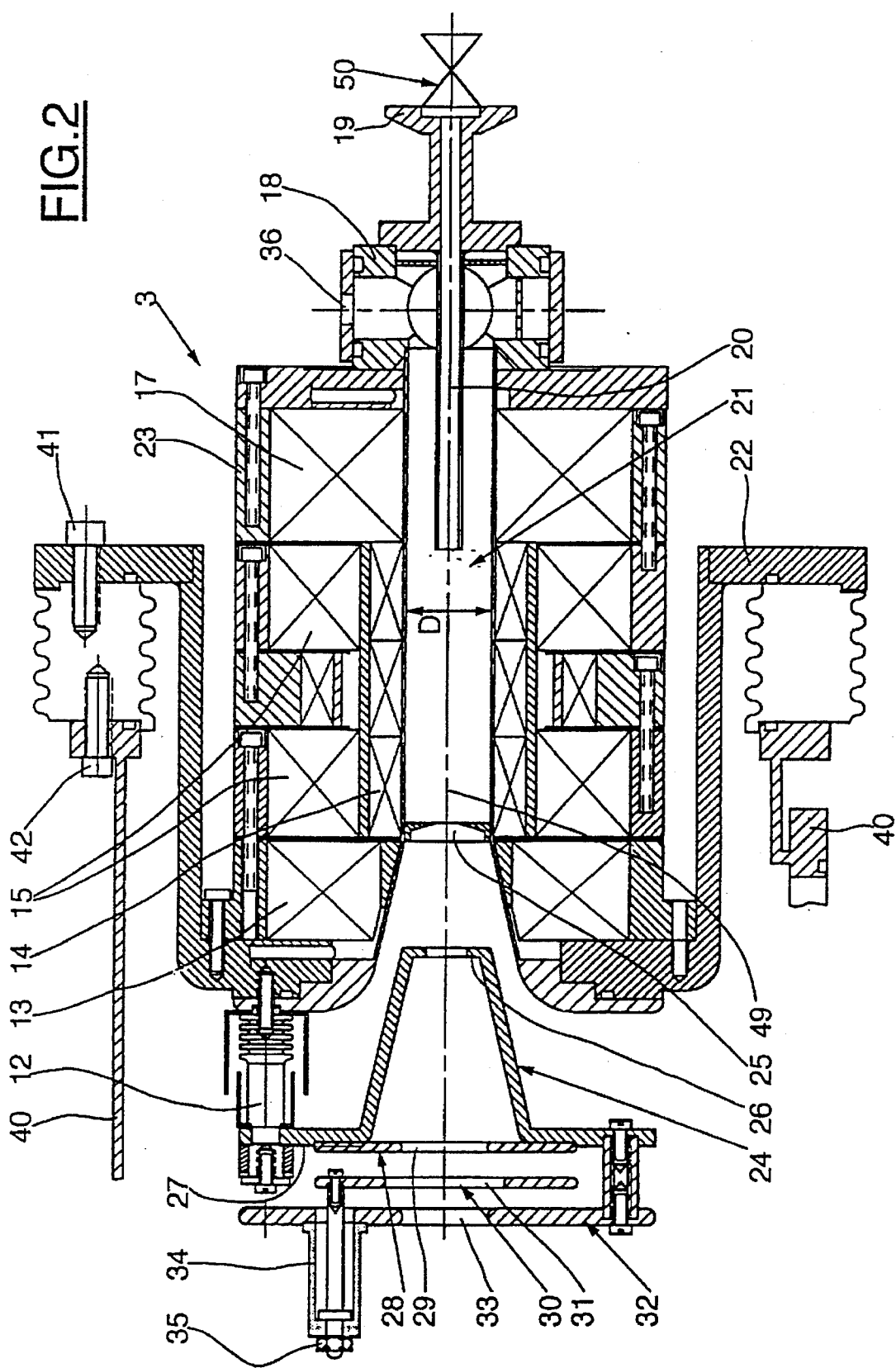
Figure 3:
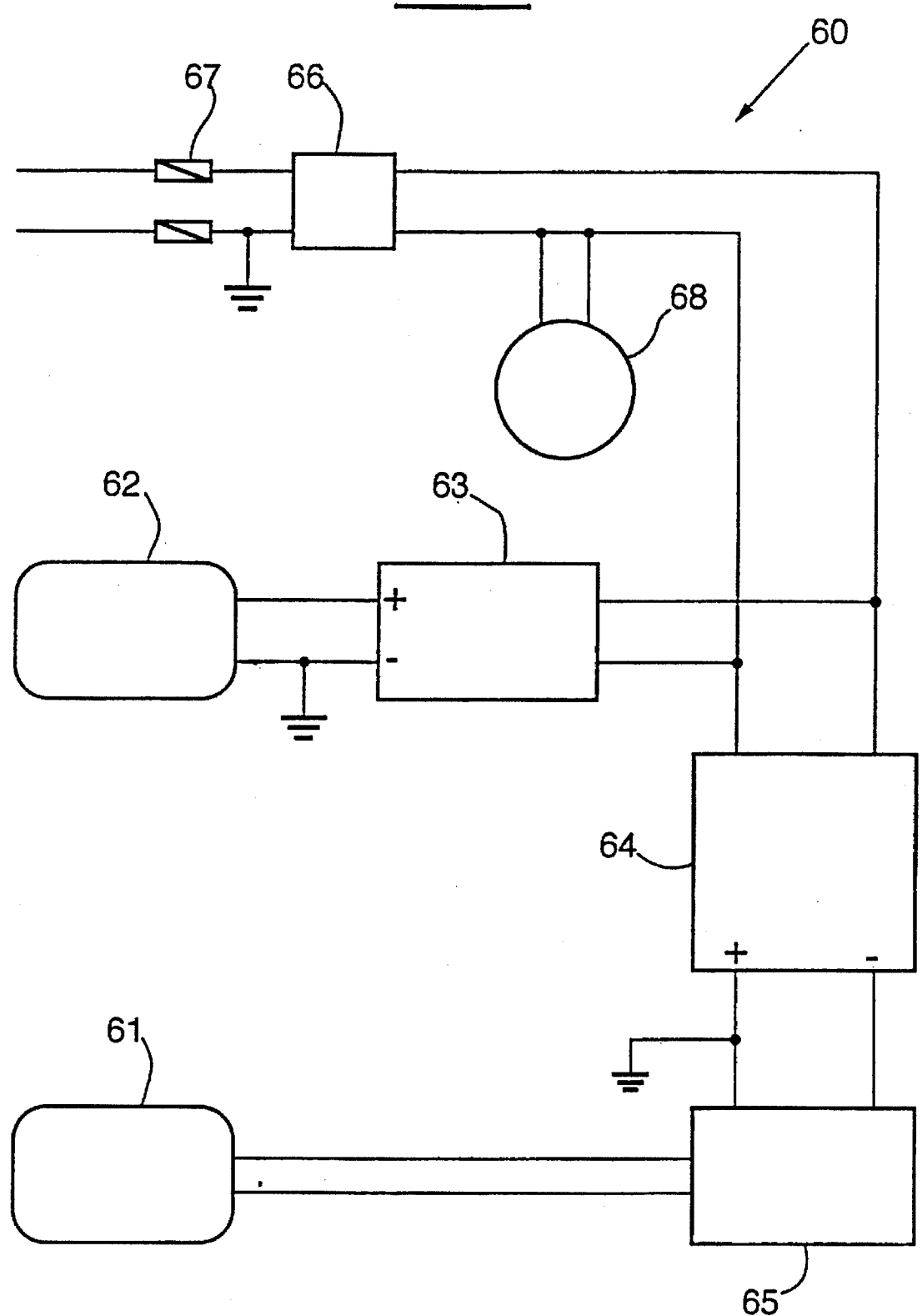

Other advantages and characteristics of the invention will appear upon examination of an entirely nonlimiting embodiment and of the appended drawings in which:

FIG. 1 diagrammatically illustrates the structure of an ion implanter of the prior art;

FIG. 2 illustrates an embodiment of an electron cyclotron resonance multiply-charged ion source according to the invention; and FIG. 3 diagrammatically illustrates the main components of the microwave power-supply module for the source in FIG. 2.

Conventional industrial implanters, allowing ion implantation at 200 or even 250 keV, have a structure similar to that shown diagrammatically in FIG. 1. More precisely, such an implanter 1 includes, inside a high-voltage chamber 2, an ion source 3, generally a hot-filament or cold-cathode source, connected to an electrical power-supply unit 4 as well as to a container 5 of gas capable of being ionized by the electrons emitted from the electrically powered cathode to a biased anode.

The ion source 3 produces an ionized beam 6 in the direction of a scantling magnet 7 whose function to separate out the ions as a function of their mass/charge ratio so as to obtain, as output, the ions actually desired for ion implantation of the wafer 10. The beam coming from the scanning magnet 7 is then accelerated in an accelerating tube 8 which imparts the energy required for implantation (from 200 to 250 keV). The rest of the implanter is shown diagrammatically by a tube 9, which specially includes vacuum pumps, and means intended for directing the ion beam toward the wafer 10.

It is possible to distinguish among the types of industrial implanters those operating at low current, medium current and high current. By "current" is meant here the total beam current measured just downstream of the accelerator tube 8.

An implanter is of the medium-current type when the total beam current is between approximately 100 µA and approximately 5 mA. It is of the low-current type when the total beam current is less than 100 µA.

One of the means of the invention consists of an electron cyclotron resonance multiply-charged ion source (ECR source) which will in particular be able to be inserted into an implanter of the type illustrated in FIG. 1 instead of the conventional source with which the implanter is equipped. One exemplary embodiment of such an ECR source according to the invention is illustrated in FIG. 2.

The multiply-charged ion source according to the invention enables it, in combination with a small-sized microwave generator, to be arranged inside a standard industrial implanter without greatly modifying the other elements of the high-voltage chamber of this implanter.

According to the invention, the source 3 includes, inside a casing 23 integrally equipped with a fastening flange 22, a waveguide-forming plasma cavity 21 having a characteristic dimension D. This characteristic dimension is a dimension measured in the transverse plane, that is to say perpendicular to the longitudinal axis of symmetry 42 of the source, and is in fact, in the present case, the diameter D of the waveguide 21.

At its right-hand end in the figure, the source includes a transition cavity 18 between the plasma cavity 21 and the aperture 36 to which is fastened, via microwave tuning means, a waveguide (for reasons of simplification, these two means have not been shown) connecting the plasma cavity to the microwave generator.

The characteristic dimension D of the plasma cavity is of the same order of magnitude as the wavelength of the electromagnetic field injected into said cavity. By "same order of magnitude" is meant here a ratio D/λ (where λ denotes the wavelength of the electromagnetic field) lying between approximately 0.5 and approximately 1.5. Moreover, the microwave electromagnetic field is generated at a frequency at least equal to 6 GHz, typically 10 GHz. The combination of these two characteristics results in a plasma cavity of small diameter, typically of the order of 26 mm for a frequency of 10 GHz being obtained. Consequently, the small diameter of this plasma cavity enables the fastening flange of the source to have a small overall external diameter, typically 40 cm, thus making it easily possible to arrange this source 3 instead of the conventional source 3 of a standard industrial implanter.

The plasma cavity 21, the length of which is typically of the order of 100 mm, is surrounded by juxtaposed permanent magnets, advantageously having high coercivity because of the small size of the ion source. These magnets firstly include an injection magnet 17, having a radial magnetization, located in the region of the output end of the coaxial tube 20 for injecting the gaseous medium into the cavity 21. Next, the wall of the cavity 21 is surrounded by a system of octupole magnets 14 having radial magnetization, defining a radial magnetic confinement field in the plasma cavity 21. Provided around this sytem of magnets 14 is another system of permanent magnets 15 having axial magnetization, contributing to the creation of an axially symmetric magnetic field. Finally, provision is made to arrange, around the cavity 21, between the plasma electrode 25 and the extraction electrode 24, an extraction magnet 13 having radial magnetization, forming, with the injection magnet 17, two magnetic mirrors. Cyclotron resonance is obtained by the conjugate action of a microwave electromagnetic field injected into the cavity and of the axially symmetric magnetic field, the value of the induction of which is a minimum in the transverse midplane of the cavity.

The fastening flange 22 of the ion source is fastened to a frame 40 of the implanter via an electrical insulator 16 and by fixing screws 41 and 42. The insulator 16 is chosen so as to withstand a very high potential difference, typically 20 kV, existing, on the one hand, between the fastening flange 22 connected to the supply voltage for the source, typically 20 kV, via, for example, a power cable fastened in the region of the screw 41, and, on the other hand, the grounded frame 40 of the implanter.

The plasma electrode 25 is therefore also at the 20 kV potential, while the extraction electrode 24 is at ground potential, thereby enabling the ions formed in the cavity 21 to be accelerated. Another electrical isolator 12, arranged between this extraction electrode 24 and the front face of the casing of the source, is therefore provided.

This extraction electrode 24 is formed by a cone which is flared toward the output of the source, that is to say toward the left-hand side of FIG. 2. A hole, centered on the longitudinal axis 49 of the source and having a diameter of 12 mm, is drilled in the smaller-sized front face 26 of this cone. The vertex half-angle of this cone is of the order of 13°.

Arranged on the flared face of the extraction cone 24 is a first plane electrode 28 drilled with a hole 29 arranged so as to be coaxial with the hole drilled in the extraction cone 24. The diameter of this hole 29 is typically of the order of 26 mm.

Held at some distance (of the order of a centimeter) from the flared face of the extraction cone 24, and rigidly secured to the latter, is another plane electrode 32, parallel to the electrode 28, and also drilled with a hole 33 which is arranged so as to be coaxial with the hole 29. The extraction cone and the two plane electrodes 28 and 32 are at the same potential, namely ground.

Arranged between the two electrodes 28 and 32 is a plane central electrode 30, also drilled with a hole 31 coaxial with the holes 29 and 33. Although the diameter of the hole 33 in the terminal electrode 32 is typically of the order of 26 mm, the diameter of the hole 31 in the central electrode 30 is typically of the order of 36 mm. This central electrode is fastened via an electrical insulator 34 to the terminal electrode 32 and is raised, by means of a power supply cable in contact with a nut 35, to a chosen bias voltage, typically from 2 to 3 kV.

The three electrodes 28, 30 and 32 form here an Einzel lens or, more generally, an ion optics system for adjusting the geometrical characteristics of the ion beam extracted from the cavity. This ion optics system interacts with the extraction electrode 24 of the source, and one of the functions of this ion adjustment optics system is to focus the ion beam extracted from the cavity onto the object focal point of the scanning magnet 7, which focusing allows the ion beam to pass entirely into the scanning element.

More precisely, the flared extraction cone, matched to the general shape of the plasma in the cavity 21, enables the plasma to be channeled and extracted in the form of a beamwhose diameter corresponds substantially to the characteristics of the scanning magnet of the implanter. Thus, although the usual diameter of the ionized beam extracted from an ECR source, like the one described in EP-0,527, 082, is of the order of a few millimeters, which would be easily suitable for isotope separation applications, the extraction cone of the source according to the invention makes it possible, in the present case, to obtain a diameter of a few centimeters, which is an order of magnitude compatible with the characteristics of the scanning magnets of most conventional implanters.

Furthermore, because of the potential differences between the central electrode of the Einzel lens and the two electrodes surrounding it, the beam leaving the cone is firstly attracted to the central electrode, converging toward the latter through the hole 29 in the electrode 28, and then repelled from the central electrode toward the output of the source through the hole 33. The configuration of such an ion adjustment optics system, in which the two electrodes surrounding the central electrode are at the same potential, prevents any loss of energy as the beampasses through this ion optics system. Furthermore, this characteristic, as well as the combination of paths of the beam from the hole in the extraction cone right to the output of the source, produces an ion beam having very good radial symmetry. Furthermore, the ion adjustment optics system enables the shaping of the ion beam to be perfected, especially as regards its diameter and its focusing, in order to match it perfectly to the scanning magnet, in particular as regards its object focal point. The shaping of this ion beam, that is to say especially the adjustment of the focusing of the latter onto the object focal point of the scanning element of the implanter, is carried out by combining adjustment of the supply high voltage for the source with adjustment of the supply voltage for the central electrode of the adjustment optics system.

Generally, standard industrial implanters are equipped, upstream of the scanning magnet, with a biased diaphragm matched to the characteristics of the ion beams extracted from conventional hot-filament sources, and intended to focus the ion beam extracted from the source onto the object focal point of the scanning magnet. However, since the geometrical characteristics of an ion beam produced by a hot-filament source are completely different from the geometrical characteristics of an ion beam produced by an electron cyclotron resonance multiply-charged ion source, especially as regards the beam diameter, simply fitting the existing biased diaphragm to an ECR source as described in EP 0,527,082 would not allow the implanter to operate satisfactorily. Furthermore, conventional biased diaphragms do not allow precise beam shaping. Thus, it is advantageous to remove the present biased diaphragm in the standard implanter and to replace the hot-filament source with the ECR source according to the invention, equipped with its extraction cone and with its ion adjustment optics system. For this purpose, it should be noted that the power supply for the ion adjustment optics system uses the same means as the power supply for the biased diaphragm of the conventional implanter. Such an ECR source according to the invention, equipped with its adjustment optics system thus makes it very simple to fit such means to most standard industrial implanters, whatever the characteristics of the scanning magnet and, especially, the positioning of its object focal point.

Arranged in the region of the input end of the coaxial injection tube 20 is a flange 19 interacting with a valve 50 for admitting the gaseous medium into the plasma cavity 21. This valve is of the ultravacuum type, this name being well known to those skilled in the art. In other words, it includes two seats facing each other, made of different metallic materials. Such a valve, for example the leakage valve marketed by the French company RIBER under the reference VMF-8, is distinguished from a conventional valve, of the needle-valve type for example, in which a needle moves on a seat. In fact, whereas this latter type of valve lets the gases through in bursts, thus making it virtually impossible to maintain, in operation, a vacuum in the plasma cavity less than $10^{-6}$ torr which is necessary in order to obtain multiply-charged ions, the ultravacuum-type valve is a means allowing the vacuum to be maintained at this very low pressure value, and especially a few $10^{-7}$ torr which enables multiply-charged ions to be obtained, and in particular highly charged phosphorus ions, for example $p^{4+}$ or $p^{5+}$, or indeed $p^{6+}$, phosphorus ions. Furthermore, the use of such an ultravacuum-type valve avoids contaminating the inside of the cavity with pollutants, for example oxygen or water vapor, when admitting the gaseous medium.

The gaseous medium used is a complex gaseous medium, namely one composed of a gas of complex chemical formulation, that is to say having atoms different from those intended to produce the ions desired. Thus, in order to produce phosphorus ions, it will be advantageous to choose phosphine ($PH_3$) or else a fluoride ($PF_5$) or a chloride ($PCl_5$) if the desired multiply-charged phosphorus peak does not run the risk of interfering, from the mass/electric charge ratio standpoint, with the fluorine or chlorine present in the molecule. Likewise, in order to produce boron ions, diborane ($B_2H_6$), or else a gas of chemical formulation $BF_3$ or $BCl_3$, will be chosen and, in order to produce arsenic, arsine ($A_sH_3$) [sic] or a gas of chemical formulation $A_sF_5$ [sic] or $A_sCl_3$ [sic] will be chosen.

In general, it will be possible to use the hydrides, fluorides and chlorides of conventional dopants used in microelectronics, and adapted to the nature of the semiconductor used (silicon, III–V, IV–VI compounds, etc.).

These complex gaseous media are therefore distinguished from simple gases, such as hydrogen, neon, xenon, argon, oxygen, tungsten or titanium, which can be used especially in isotope separation applications.

The microwave power supply for the ECR source 3 is diagrammatically illustrated in FIG. 3. After protection by fuses 67 and a filter 66, a 115 V voltage is available at the terminals of a power-supply board 63 intended to deliver a 12 V DC voltage, as well as at the terminals of a stabilized power supply 64 intended to deliver a 25 V voltage at 5 A. The power-supply unit 63 supplies an oscillator 62 operating at 6 GHz at least, typically at 10 GHz, with a power of 15 mW. The stabilized power supply 64 supplies a power-supply board 65 of a traveling-wave tube 61, the minimum required power of which is a few watts and preferably 40 W. This traveling-wave tube 61 is connected via a variable attenuator (not shown here for reasons of simplification) to the oscillator 62. This traveling-wave tube 61 therefore amplifies, in the general case, an electromagnetic field with a frequency greater than 6 GHz (and in the present case, with a frequency equal to 10 GHz) using a microwave oscillator, for example the dielectric resonator from the French company Advantest GIGA, "GMRFN 10R00 10F" series. The use of a traveling-wave tube, like the one available from the company THOMSON CSF under the reference TH 21738, generally used in the radar field, makes it possible to reduce the size of the microwave generator to 40 dm$^3$ (40×40×25 cm$^3$), which makes it possible to incorporate all the components of the microwave power supply, these being illustrated in FIG. 3 and ventilated by means of a fan 68, into the casing of the power-supply unit 4 of an ion source, for example a hot-filament source, conventionally arranged in an implanter of the type illustrated in FIG. 1. For this purpose, the tube, having a length of approximately 300 mm, has been arranged along the longest dimension of the casing of the power-supply unit, the various boards having been placed around said tube.

The source according to the invention, equipped with its microwave power supply, little [sic] be easily fitted into the NV-3206 implanter from the American company EATON. Using a gaseous medium composed of pure phosphine, it has been possible, with an extraction voltage of 18.6 kV (for a maximum available voltage of 20 kV) and suitable adjustment of the Einzel lens (2.8 kV), to obtain, at the wafer to be implanted, a phosphorus current of 24.2 µA for $P^+$ ions, 37.8 µA for $P^{2+}$ ions, 48.9 µA for $p^{3+}$ ions, 44.3 µA for $p^{4+}$ ions, 34 µA for $p^{5+}$ ions and 6.1 µA for $p^{6+}$ ions. It should be noted that the use of the ultravacuum-type valve makes it possible to obtain, during running, a vacuum of $2.4 \times 10^{-7}$ torr whereas the basic vacuum in the source (when not operating) is $2.1 \times 10^{-7}$ torr.

The profile of the oxygen atoms (coming from, for example, water vapor (imperfect vacuum)) and of the fluorine atoms (in the case of the use of fluoride) shows that the $p^{4+}$ peak, the mass/charge ratio of which is of the order of 7.75, and the $p^{5+}$ peak, the mass/charge ratio of which is of the order of 6.2, are not disturbed by the respective spurious peaks from the $O^{2+}$ oxygen atoms and $F^{3+}$ fluorine atoms. The various internal modifications of the high-voltage terminal of the implanter have allowed this implanter, having an initial implantation energy of from 200 to 250 keV, to be converted into a high-energy implantation machine (1 MeV for $P^{4+}$ ions or even 1.5 MeV for $p^{6+}$ ions). It has thus been possible to implant with doses of $10^{14}$ ions per cm² at 2, 3, 4, 5 or 6 times the maximum energy of the implanter, and this being achieved in a time compatible with production requirements (a $10^{14}$ dose obtained in two minutes for a wafer 100 mm in diameter). Finally, these operating conditions, which do not require the use of a hot filament, or of moving parts, or of a low pressure in the plasma chamber, considerably increase the lifetime of the source compared to that of hot-filament sources.

I claim:

1. High-energy implantation process using an ion implanter of the low- or medium-current type, characterized in that:

a microwave generator, having a traveling-wave tube generating an electromagnetic field with a frequency greater than or equal to 6 GHz, is arranged in the implanter;

an electron cyclotron resonance multiply-charged ion source (3) is arranged in the implanter, this source including a waveguide-forming plasma cavity (21) whose characteristic dimension (D), in the transverse plane of the cavity, is of the same order of magnitude as the wavelength of the electromagnetic field;

the microwave generator (60) and the plasma cavity (21) of the multiply-charged ion source are electromagnetically coupled;

a complex gaseous medium, compatible with the beam of ions desired, is admitted into the plasma cavity and the inlet flow rate of the gaseous medium is adjusted so as to maintain a residual vacuum in the plasma cavity which is less than a pressure threshold compatible with the production of multiply-charged ions; and the focusing of the ion beam extracted from the plasma cavity is adjusted onto the focal point of the scanning magnet (7) of the implanter.

2. Process according to claim 1, characterized in that the pressure threshold is equal to approximately $10^{-6}$ torr.

3. Process according to claim 1, characterized in that the microwave generator is housed in the casing of the power-supply unit for the initial ion source of the implanter.

4. Process according to one of claim 1, characterized in that the output end of the electron cyclotron resonance ion source is equipped with an ion optics system for adjusting the geometrical characteristics of the ion beam extracted from the plasma cavity and the focusing of the ion beam extracted from the plasma cavity is adjusted onto the object focal point of the scanning magnet of the implanter by adjusting the supply voltage of the ion optics system for adjusting the source.

5. Process according to one of claim 1, characterized in that the complex gaseous medium is chosen from the group formed by the hydrides, fluorides and chlorides of the dopants compatible with the nature of a semiconductor material to be implanted.

6. Process according to claim 1, characterized in that the inlet flow rate of the complex gaseous medium into the plasma cavity is adjusted so as to maintain a pressure of a few $10^{-7}$ torr in the cavity in operation.

7. Device for generating an ionized gas beam for an ion implanter of the low- or medium-current type, characterized in that it comprises an electron cyclotron resonance multiply-charged ion source (3) including a waveguide-forming plasma cavity (21) which is capable of receiving a complex gaseous medium compatible with the ion beam generated and is coupled to a microwave generator (60) having a traveling-wave tube (61) generating an electromagnetic field with a frequency greater than or equal to 6 GHz, the plasma cavity (21) having a characteristic dimension (D), in the transverse plane of the cavity, of the same order of magnitude as the wavelength of the electromagnetic field, in that the source (3) is provided at its output end with an ion optics system (28, 30, 32) for adjusting the geometrical characteristics of the beam extracted from the cavity, said ion optics system being controllable and interacting with the extraction electrode (24) of the ion source, and in that the source is provided at its input end with means for admitting the gaseous medium, which are compatible with maintaining a residual vacuum pressure of less than $10^{-6}$ torr in operation.

8. Device according to claim 7, characterized in that the extraction electrode (24) includes a cone for extracting the ionized plasma beam, this cone flaring out toward the output of the source, and in that the ion adjustment optics system includes a first drilled plane electrode (28) arranged on the flared face of the extraction cone (24), a second drilled plane electrode, spaced away from the first one and at the same potential as that of the extraction cone (24) and of the first electrode (28), and a plane and drilled central electrode (30) which is arranged between the first and second electrodes (28, 32) and biased with respect to the two electrodes by an adjustable bias voltage.

9. Device according to claim 7, characterized in that the ion optics system is fastened to the source by a first electrical isolator (12) while the source is secured to a fastening flange (22) equipped with a second electrical isolator (16), said fastening flange being intended to be fastened via this second electrical isolator to the ion implanter (40).

10. Device according to one of claim 9, characterized in that the microwave generator forms a microwave supply module (60) separated from the source equipped with its fastening flange and with its ion adjustment optics system, the supply module having a working volume of less than 50 dm³ and including the traveling-wave tube (61) connected to an oscillator (62) via a variable attenuator, as well as the power-supply units for the elements, and in that the microwave supply module is coupled to the plasma cavity of the source via a waveguide.

11. Device according to claim 7, characterized in that the means for admitting the complex gaseous medium include an inlet valve (50) of the ultravacuum type.

12. Device according to claim 7, characterized in that the frequency of the electromagnetic field, generated by the microwave generator, is of the order of 10 GHz and in that the power of the traveling-wave is of the order of 40 W.

13. Multiply-charged ion source for an ion implanter of the low- or medium-current type, characterized in that it is of the electron cyclotron resonance type and includes a waveguide-forming plasma cavity (21) whose characteristic dimension (D), in the transverse plane of the cavity, is of the same order of magnitude as the wavelength of the electromagnetic field to which it is intended to be coupled, an ion output optics system (28, 30, 32) for adjusting the ion beam extracted from the cavity, said optics system being controllable and interacting with a beam extraction cone (24) of the source, and a valve (50), of the ultravacuum type, for admitting a complex gaseous medium into the cavity.

14. Source according to claim 13, characterized in that the characteristic dimension of the cavity is of the order of 3 cm and in that the source is equipped with a flange for fastening to the implanter, the external diameter of which is of the order of 40 cm.

15. Use, in an ion implanter of the low- or medium-current type, of a microwave generator having a traveling-wave tube generating an electromagnetic field with a frequency greater than or equal to 6 GHZ and of an electron cyclotron resonance multiply-charged ion source coupled to this generator, the characteristic dimension of the plasma cavity of which source, in its transverse plane, is of the same order of magnitude as the wave-length of the electromagnetic field.

\* \* \* \* \*